United States Patent
Gardner et al.

[19]

[11] Patent Number: 6,140,190
[45] Date of Patent: *Oct. 31, 2000

[54] METHOD AND STRUCTURE FOR ELEVATED SOURCE/DRAIN WITH POLISHED GATE ELECTRODE INSULATED GATE FIELD EFFECT TRANSISTORS

[75] Inventors: Mark I. Gardner, Cedar Creek; Thomas E. Spikes, Jr., Round Rock; Michael P. Duane, Austin, all of Tex.

[73] Assignee: Advanced Micro Devices, Sunnyvale, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/993,388

[22] Filed: Dec. 18, 1997

[51] Int. Cl.<sup>7</sup> .................................................. H01L 21/336
[52] U.S. Cl. .......................... 438/300; 438/305; 438/585; 438/595
[58] Field of Search ...................................... 438/300, 299, 438/301, 688, 684, 564, 585, 592, 595, 305, 683

[56] References Cited

U.S. PATENT DOCUMENTS

| | | | |
|---|---|---|---|
| 4,677,736 | 7/1987 | Brown | 438/297 |
| 5,028,552 | 7/1991 | Ushiku | 437/217 |
| 5,234,847 | 8/1993 | Iranmanesh | 438/202 |
| 5,496,750 | 3/1996 | Moslehi | 438/300 |
| 5,856,225 | 1/1999 | Lee et al. | 438/291 |
| 5,879,997 | 3/1999 | Lee et al. | 438/300 |

*Primary Examiner*—Michael Trinh

[57] ABSTRACT

A method and structure are provided for an IGFET which has elevated source/drain regions and polished gate electrode. The IGFET provides raised doped polysilicon regions between the source/drain areas and subsequent metallization layers. The doped polysilicon regions are scalable. Integration of elevated source/drain regions provides a shallow junction for high performance IGFET design. A refractory metal gate is provided without sacrificing the fabrication advantage of self-aligned techniques. A method to produce an IGFET which incorporates both of the above advantages into a single device, with relatively few process steps, is also provided. Fabricating the gate electrode in this manner will enable metal gate electrodes to be integrated with source/drain structure.

21 Claims, 3 Drawing Sheets

METHOD AND STRUCTURE FOR ELEVATED SOURCE/DRAIN WITH POLISHED GATE ELECTRODE INSULATED GATE FIELD EFFECT TRANSISTORS

RELATED APPLICATIONS

This application is related to the co-filed and commonly assigned application (entitled "Method and Structure for Replaceable Gate Electrode in Insulated Gate Field Effect Transistors," which is hereby incorporated by reference.

FIELD OF THE INVENTION

The present invention relates generally to semiconductor integrated circuits. More particularly, it pertains to a method and structure for elevated source/drain regions with polished gate electrode in insulated gate field effect transistors.

BACKGROUND OF THE INVENTION

An insulated-gate field-effect transistor (IGFET), such as a metal-oxide semiconductor field-effect transistor (MOSFET), uses a gate to control an underlying surface channel joining a source and a drain. The channel, source and drain are located in a semiconductor substrate, with the source and drain being doped oppositely to the substrate. The gate is separated from the semiconductor substrate by a insulating layer such as a gate oxide. The operation of the IGFET involves application of an input voltage to the gate, which sets up a transverse electric field in the channel in order to modulate the longitudinal conductance of the channel.

In typical IGFET processing, the source and drain are formed by introducing dopants of second conductivity type (P or N) into a semiconductor substrate of first conductivity type (N or P) using a patterned gate as a mask. This self-aligning procedure tends to improve packing density and reduce parasitic overlap capacitances between the gate and the source and drain.

Polysilicon (also called polycrystalline silicon, poly-Si or poly) thin films have many important uses in IGFET technology. One of the key innovations is the use of heavily doped polysilicon in place of aluminum as the gate. Since polysilicon has the same high melting point as a silicon substrate, typically a blanket polysilicon layer is deposited prior to source and drain formation, and the polysilicon is anisotropically etched to provide a gate which provides a mask during formation of the source and drain by ion implantation. Thereafter, a drive-in step is applied to repair crystalline damage and to drive-in and activate the implanted dopant.

Several objectives influence IGFET design and fabrication. First, there is a desire to reduce the dimensions of the IGFET. Increasing the number of individual IGFETs that can be placed onto a single silicon chip or die produces increased functionality per chip. Second, there is a continual desire is to improve performance, and particularly the speed, of the IGFET transistors. This pursuit is manifested in shorter conduction channel lengths. Shorter channel lengths offer increased IGFET speed and allow for a greater number of operations to be performed in less time. IGFETs are used in great quantity in computers where the push to obtain higher operation cycle speeds demands faster IGFET performance. Lastly, there exists a constant need to maintain costly IGFET fabrication steps at a minimum.

As the feature dimensions of the IGFET device dwindle, new performance hurdles present themselves. One particular difficulty involves contact resistance between the IGFET and different metallization layers. Contact resistance is influenced by the materials, the substrate, doping and the contact dimensions. Refractory metals and their silicides offer lower contact resistance but have other limitations, such as for use in a self-alignment process. Refractory metals are popular for filling via holes, a process known as plug filling, in multi-level metal structures. Polysilicon, on the other hand, has been more popular for use as gate contact due to their utility for producing "self-aligned" source/drain regions. A gate formed from polysilicon structure will serve as a mask whereby the subsequent source/drain doping aligns the dopants next to the gate. Polysilicon is also well suited for the salicidation process where self-alignment technique is combined with an additional layer of a refractory metal silicide. The silicide is formed by reaction of the refractory metal with the underlying polysilicon through an alloy step. There have been serious efforts on the use of tungsten and other refractory metal gates as a mask in a self-aligned process. However, even though these metals tolerate high temperatures, their thermal budget tends to limit anneal temperatures for the source/drain implants.

A continual need exists for creating improved junctions between the IGFET structures and subsequent metallization layers. Thus, it is desirable to produce source and drain junctions which are scalable in size and material in order to improve contact resistance. It is also desirable to form gates which offer decreased contact resistivity. Further, a method is desirable to achieve the above mentioned results while keeping costly fabrication steps to a minimum.

SUMMARY OF THE INVENTION

A method for forming a device which has elevated source/drain regions with a polished gate electrode is provided. The method of fabrication includes forming a transistor. The transistor includes a first gate material, with opposing sides, on the surface of a gate oxide. A source region and a drain region are provided. A pair of dielectric spacers are disposed adjacent to the opposing sides of the first gate material. The first gate material having a high selectivity to the gate oxide and to the dielectric spacers. The method of fabrication includes depositing doped polysilicon regions over the source and over the drain. Also, according to the method of fabrication, the first gate material is removed and a metal layer is deposited.

In one embodiment, depositing a metal layer comprises depositing a refractory metal directly on the gate oxide to serve as a second gate material subsequent to the removal of the first gate material. The first gate material is nitride and is removed by reactive ion etching (RIE).

A device is provided which has elevated source/drain regions with a polished gate electrode. The device includes a transistor on a semiconductor substrate. The transistor has a gate with opposing sides, formed of a refractory metal, and position over a gate oxide. The transistor has a source region and a drain region. A pair of dielectric spacers are disposed adjacent to opposing sides of the gate. Doped polysilicon regions are located over the source and over the drain and a metal layer is provided on the doped polysilicon regions. In one embodiment, the gate is formed by removing a nitride layer from a top surface of the gate oxide and then depositing in its place a refractory metal. Lightly doped drain region and a lightly doped source region underneath the dielectric spacers.

An information handling system is also provided which includes the above device. The system has a central processing unit, a random access memory; and a system bus for coupling the central processing unit to the random access memory. As stated, the system includes the above device along with each of its features. Those features a transistor on a semiconductor substrate. The transistor has a gate, formed of a refractory metal, position over a gate oxide. The transistor has a source region and a drain region. A pair of dielectric spacers are disposed adjacent to opposing sides of the gate. Doped polysilicon regions are located over the source and over the drain and a metal layer is provided on the doped polysilicon regions.

Thus an improved IGFET is provided which offers raised doped polysilicon regions between the source/drain areas and subsequent metallization layers. The doped polysilicon regions are scalable. A refractory metal gate is provided without sacrificing the fabrication advantage of self-aligned techniques. A method to produce an IGFET which incorporates both of the above advantages into a single device, with relatively few process steps, is also provided.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

BRIEF DESCRIPTION OF THE DRAWINGS

The following detailed description of the preferred embodiments can best be understood when read in conjunction with the following drawings, in which.

DESCRIPTION OF THE EMBODIMENTS

In the following detailed description of the preferred embodiments, reference is made to the accompanying drawings which form a part hereof, and in which are shown by way of illustration specific embodiments in which the invention may be practiced. It is to be understood that other embodiments may be utilized and structural changes may be made without departing from the scope of the present invention.

Method of Fabrication

Figure 1A:
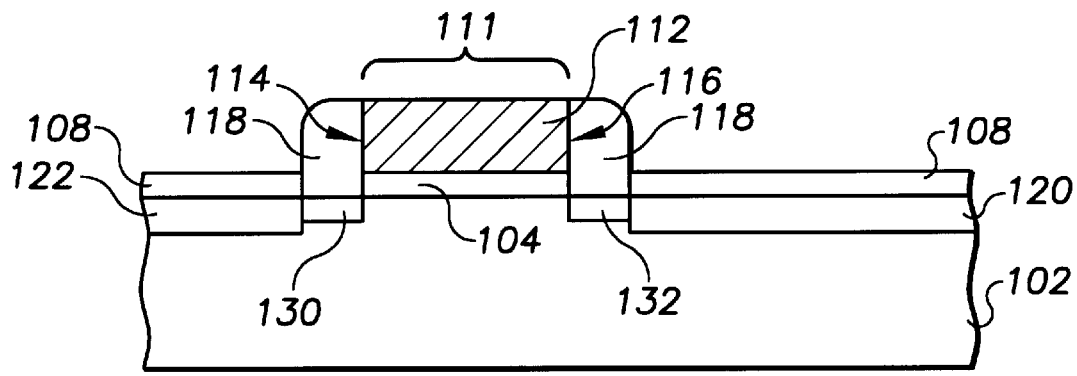
FIGS. 1A–1C show cross-sectional views of successive process steps for making an IGFET with elevated source/drain regions and polished gate electrode in accordance with an embodiment of the invention.
Figure 1B:
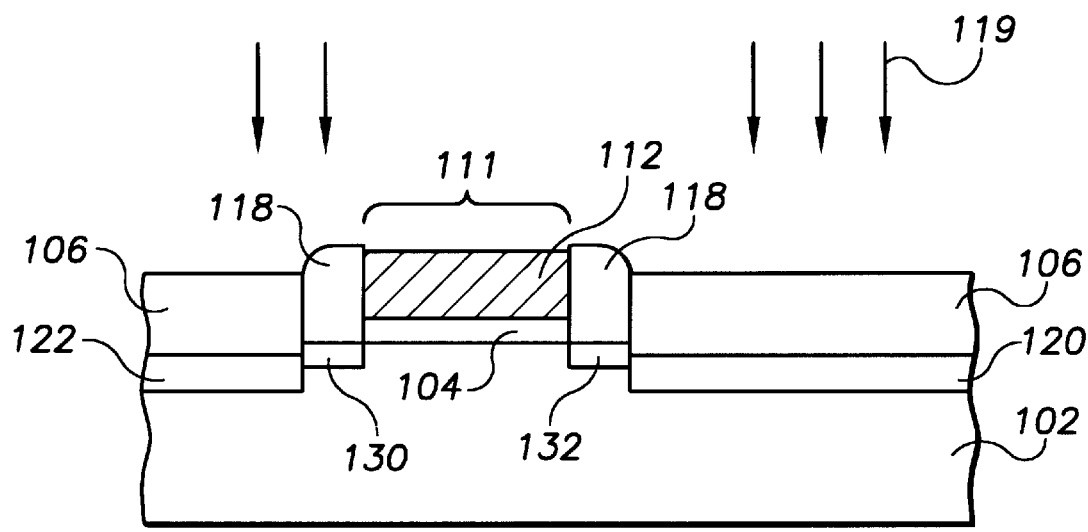
Figure 1C:
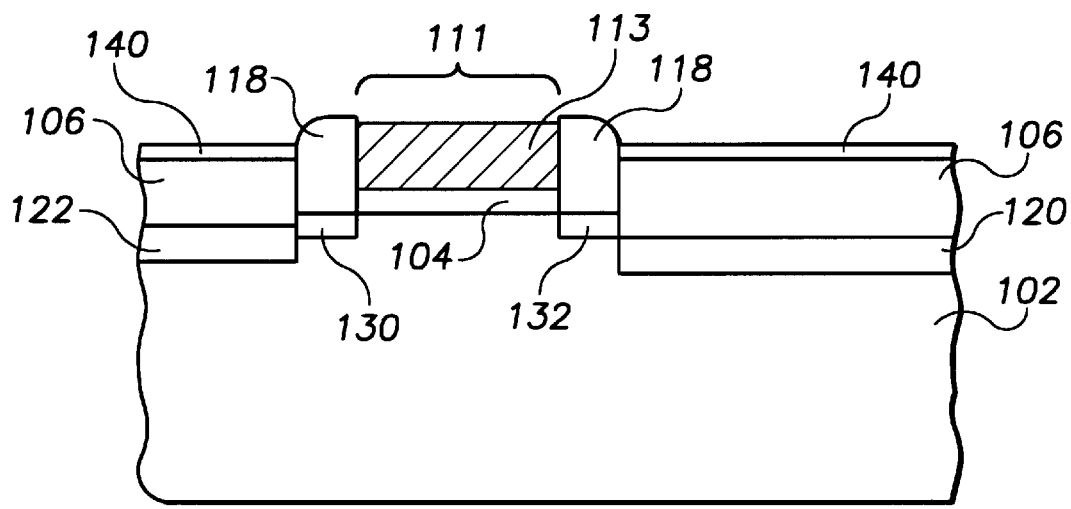

FIGS. 1A–1C, describe generally various processing techniques of one embodiment of an IGFET which has elevated source/drain regions and polished gate electrode.

In FIG. 1A, illustrates the structure at the point where the transistor fabrication has been completed through light doped source/drain (LDD) spacer formation and anneal process. FIG. 1A is the starting point for illustrating an embodiment of the fabrication process for the invention. This stage in the fabrication may be reached in a myriad of steps which do not comprise the thrust of the present invention. These processing steps are not repeated herein. Reference is made to a co-filed and commonly assigned application entitled "Method and Structure for Channel Length Reduction in Insulated Gate Field Effect Transistors," as one such approach to arriving at this structure. That application is hereby incorporated by reference.

In FIG. 1A a first gate material 112 is shown formed on a gate oxide 104. The first gate material 112 has opposing side, 114 and 116 respectively. In one embodiment, the first gate material is made of nitride. A pair of dielectric spacers 118 are disposed adjacent to the opposing sides, 114 and 116, of the first gate material 112. In an alternative embodiment, the first gate material 112 is made of any material a high selectivity to the gate oxide 104 and the pair of dielectric spacers 118. The first gate material 112 and the gate oxide 104 are shown formed on a top surface of a semiconductor substrate 102. The gate oxide includes any suitable oxide, such as silicon dioxide ($SiO_2$). The upper surface of the substrate 102 is an epitaxial layer suitable for integrated circuit manufacture. In one embodiment the substrate 102 is a P-type substrate with a boron background concentration on the order of $1 \times 10^{16}$ atoms/cm$^3$, a <100> orientation and a resistivity of 12 ohm-cm. Preferably, the epitaxial surface layer of the substrate 102 is disposed on a P+ base layer (not shown) and includes a planar top surface. In an alternative embodiment, the substrate 102 is an N-type substrate on an N+ base layer.

An oxide layer 108 is formed on the top surface of the substrate 102. The oxide layer is formed through any suitable process, such as by chemical vapor deposition (CVD). In an alternative embodiment, the oxide layer is thermally grown on the substrate 102. A source region 120 and a drain region 122 are provided within the substrate 102. Also, lightly doped source and drain regions, 130 and 132 respectively are formed underneath the pair of dielectric spacers 118. Any desired salicidation steps have been performed on the source and drain regions, 120 and 122 respectively, prior to the deposition of oxide layer 108. The first gate material 112 and the pair of dielectric spacers 118 serve as a mask over the gate region 111. This method allowed for self-alignment of the source and drain regions 120 and 122 respectively.

FIG. 1B illustrates the structure following the next sequence of process steps. The oxide layer 108 is stripped from the source and drain regions, 120 and 122 respectively. The oxide layer is stripped using any suitable buffered oxide etch process (BOE), such as a hydroflouric acid (HF) and water ($H_2O$) solution. Next doped polysilicon regions 106 are deposited in the source and drain regions, 120 and 122. The doped polysilicon regions 106 are deposited in any suitable manner, such as by chemical vapor deposition (CVD). The deposition occurs along the direction indicated by arrows 119. In one embodiment, a layer of polysilicon is deposited first, such as by CVD. Then, in a second step, the dopant is ion implanted into the surface of the polysilicon regions 106. The dopant is on N-type dopant to form an n+ silicon material for n-channel metal-oxide semiconductor field effect transistors (NMOSFETs) and -a P-type dopant to form a p+ silicon material for p-channel metal-oxide semiconductor field effect transistors (PMOSFETs). Next, a high temperature rapid thermal anneal (RTA) is performed. As those skilled in the art will appreciate, this process cures out the crystal damage induced by the previous ion implant process. The first gate material 112 and the pair of dielectric spacers 118 again serve as a mask over the gate region 111 to preserve the self-aligned character of the doped polysilicon regions 106. The structure is now as appears in FIG. 1B.

FIG. 1C illustrates the structure after the final sequence of steps. In FIG. 1C, the first gate material is removed. The first gate material is selective to both the gate oxide material 104 and the pair of dielectric spacers 118. The first gate material is remove using a reactive ion etch process (RIE). In an alternative embodiment, other suitable etching techniques may be employed. The underlying gate oxide 104 is left in place on the surface of the substrate 102. In an alterative embodiment the gate oxide is stripped using a BOE and a new gate oxide is grown or deposited in its place either by thermal growth or CVD. A refractory metal is deposited to form a new gate 113 in the gate region 111. The refractory metal is deposited by any suitable method, such as by low pressure chemical pressure deposition (LPCVD). The refractory metal is likewise deposited on a top surface of the doped polysilicon regions 106. The refractory metal deposition, by such a LPCVD process, is controllable or scalable to a desired elevation. The refractory metal deposition forms a metal layer 140, which provides electrical contact for the source, drain and gate regions, 120, 122 and 111 respectively. The structure is now as illustrated by FIG. 1C. Additional metallization layers, not included here, are achieved using conventional techniques. These further processing steps are not repeated herein. Likewise, the principal processing steps disclosed herein may be combined with other steps apparent to those skilled in the art.

Figure 2:
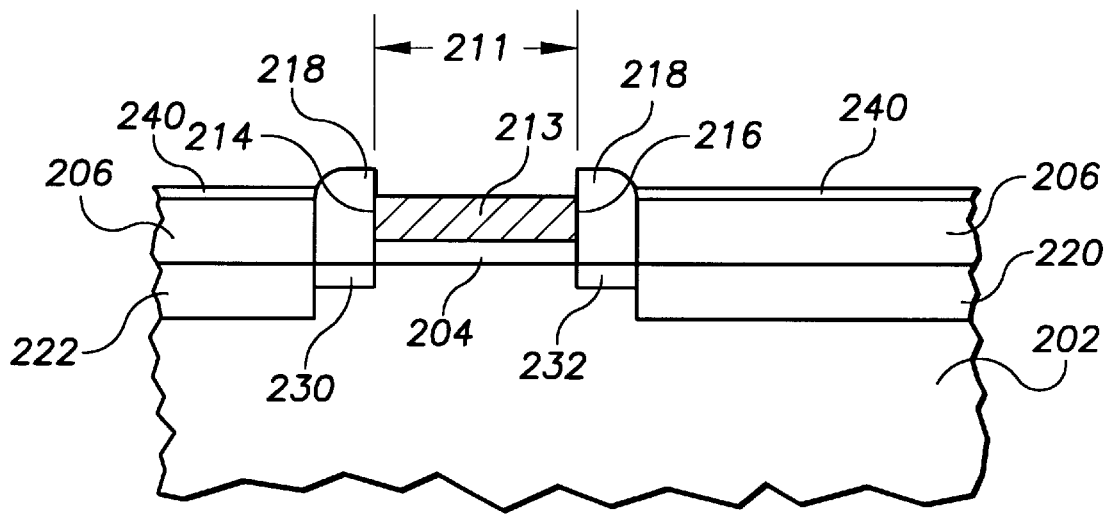
FIG. 2 illustrates the completed IGFET structure in accordance with embodiment of the invention.

The present invention includes numerous variations to the embodiment described above. For instance, the completed device illustrated in FIG. 2 is one embodiment of the invention formed on a top surface of a semiconductor substrate 202. FIG. 2 is a cross sectional view wherein a gate 213 is formed on a gate oxide 204. The gate 213 is formed of a refractory metal and has opposing sides 214 and 216 respectively. A pair of dielectric spacers 218 are disposed adjacent to the opposing sides, 214 and 216, of the gate 213. A source region 220 and a drain region 222 are provided in a manner that is self-aligned with the gate 213 and the pair of dielectric spacers 218. Lightly doped regions, 230 and 232 respectively, are provided within the substrate 202, beneath the pair of dielectric spacers 218. Doped polysilicon regions 206 are provided above the source and drain regions, 220 and 222 respectively. The gate 213 was formed by first removing a nitride layer from the gate oxide 204 and then depositing in its place a refractory metal. Before its removal, the nitride layer (not shown) and the pair of dielectric spacers 218 served as a mask to self-align the doped polysilicon regions 206 over the source and drain regions, 220 and 222 respectively. Hence, the doped polysilicon regions 206 act as scalable source/drain contacts. A metal layer 240 is formed on top of the doped polysilicon regions 206. The metal layer 240 is a refractory metal Thus the invention provides a method and structure for an IGFET in which doped polysilicon regions 206 help to the reduce the contact resistance between the IGFET structure and subsequent metallization layers. Also, by first having a nitride layer on the gate oxide 204, any fabrication process can continue to utilize self-aligned processing. The refractory metal deposited as the final gate 213 creates a gate junction with low contact resistivity.

Figure 3:
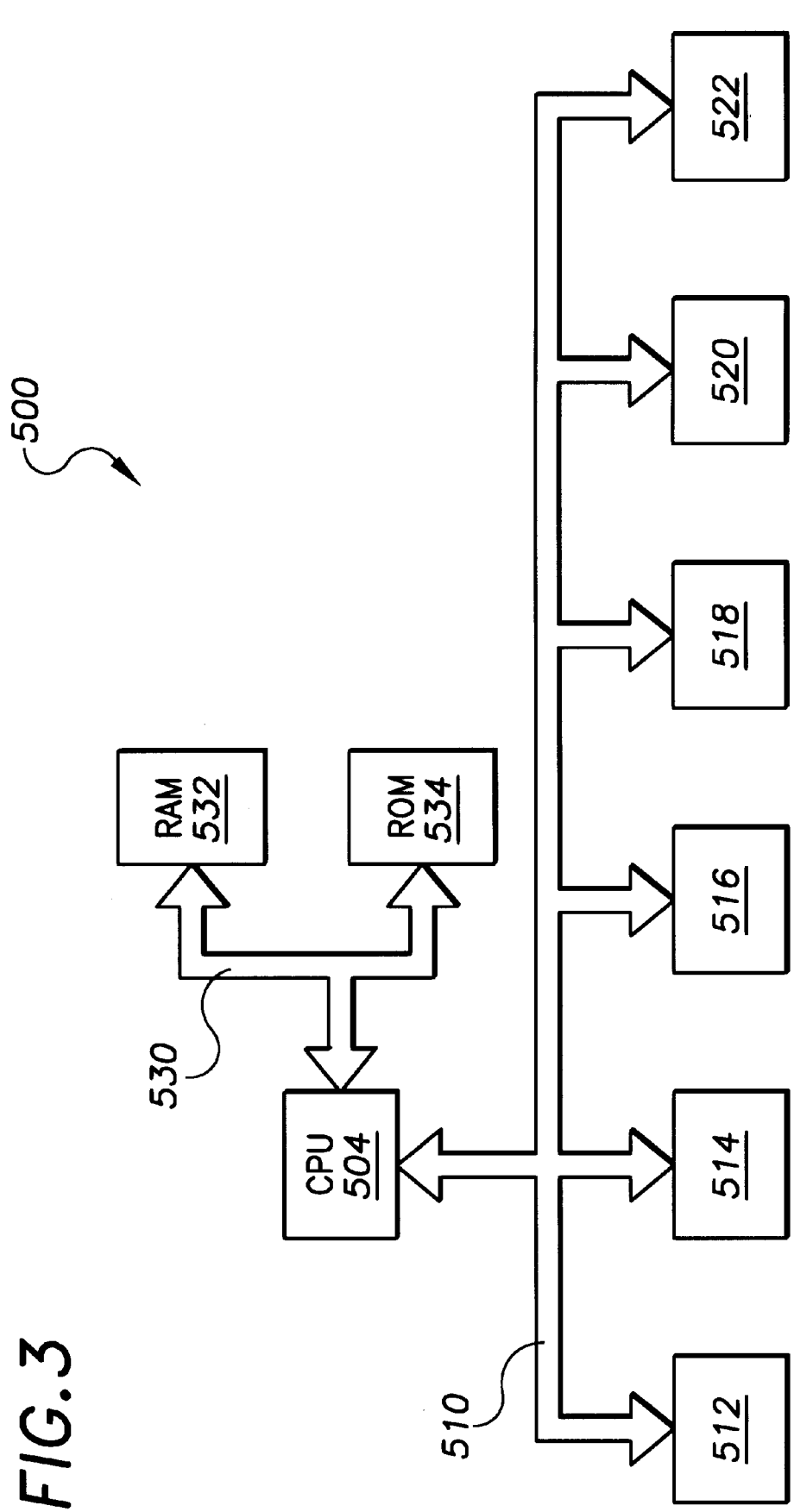
FIG. 3 is a block diagram of an information handling system to incorporate an embodiment of the invention.

Advantageously, the invention is well-suited for use in a device such as an integrated circuit chip, as well as an electronic system including a microprocessor, a memory and a system bus. The electronic system may also be an information handling system 500 as shown in FIG. 3. The information handling system includes a central processing unit 504, a random access memory (RAM) 532, a read only memory (ROM) 534, and a system bus 530 for communicatively coupling the central processing unit 504 and the RAM 532 and the ROM 534. The system 500 also includes an input/output bus 510 and several devices peripheral devices, such as 512, 514, 516, 518, 520, and 522. The device peripherals attach to the input output bus 510. Peripheral devices include hard disk drives, floppy disk drives, monitors, keyboards and other such peripherals. The information handling system 500 includes a device such as is shown in FIG. 2. Low contact resistivity at the junctions between the IGFET device and subsequent metallization layers provides for stronger and more reliable coupling of electronic data throughout the information handling system.

Although specific embodiments have been illustrated and described herein, it is appreciated by those of ordinary skill in the art that any arrangement which is calculated to achieve the same purpose may be substituted for the specific embodiments shown. This application is intended to cover any adaptations or variations of the present invention. Therefore, it is manifestly intended that this invention be limited only by the claims and the equivalents thereof.

What is claimed is:

1. A method for forming a device comprising:

forming a transistor on a semiconductor substrate, the transistor having a first gate material with opposing sides formed directly on a gate oxide; a source region, and a drain region; the transistor having a pair of dielectric spacers disposed adjacent to the opposing sides of the gate, the first gate material having a high selectivity to the gate oxide and to the dielectric spacers;

depositing doped polysilicon regions directly on the source and drain regions;

removing the first gate material; and depositing a metal layer directly on the gate oxide and the doped polysilicon regions, such that a second gate material is formed directly on the gate oxide.

2. The method of claim 1 further comprising forming the first gate material of nitride.

3. The method of claim 1 wherein depositing a doped polysilicon layer comprises:

depositing a polysilicon layer; and implanting dopants into the polysilicon layer.

4. The method of claim 3 wherein implanting dopants into the polysilicon layer comprises implanting N-type dopants to form an n+ silicon material.

5. The method of claim 3 wherein implanting dopants into the polysilicon layer comprises implanting P-type dopants to form a p+ silicon material.

6. The method of claim 1 wherein forming the source and the drain region further comprises forming a lightly doped drain region and a lightly doped source region underneath the dielectric spacers.

7. The method of claim 1 wherein removing the first gate material comprises performing a reactive ion etch (RIE).

8. The method of claim 1 wherein depositing a doped polysilicon layer over the source and over the drain further comprises using the first gate material and the dielectric spacers as a mask to produce self-aligned source and drain regions.

9. The method of claim 1 wherein depositing a metal layer further comprises forming refractory metal silicides within the source and drain regions.

10. The method of claim 1, wherein the step of forming the transistor includes forming the first gate material from an insulative material.

11. The method of claim 10, wherein the step of depositing doped polysilicon regions includes forming elevated source and drain regions by forming the source and drain regions in the substrate and then depositing doped polysilicon regions directly on the source and drain regions, the elevated source and drain regions having a height above the substrate surface equal to the height of the doped polysilicon regions.

12. The method of claim 11, wherein the step of forming the source and drain regions includes forming the source and drain regions adjacent the spacers.

13. The method of claim 12, wherein the step of depositing a metal layer on the gate oxide includes simultaneously depositing a refractory metal directly on the gate oxide and on the doped polysilicon regions, subsequent to the removal of the first gate material, wherein the refractory metal serves as a second gate material and as a metal silicide within the source and drain regions.

14. The method of claim 1, wherein the step of depositing a metal layer on the gate oxide includes simultaneously depositing a refractory metal directly on the gate oxide and on the doped polysilicon regions, subsequent to the removal of the first gate material, wherein the refractory metal serves as a second gate material and as a metal silicide within the source and drain regions.

15. The method of claim 1, wherein the step of depositing doped polysilicon regions includes forming elevated source and drain regions by forming the source and drain regions in the substrate and then depositing doped polysilicon regions directly on the source and drain regions, the elevated source and drain regions having a height above the substrate surface equal to the height of the doped polysilicon regions.

16. A method for forming a device on a semiconductor substrate comprising:

forming a gate oxide over the substrate;

forming a first insulative gate material with opposing sides directly on the gate oxide;

forming a pair of dielectric spacers disposed adjacent to the opposing sides of the gate, wherein the first gate material has a high selectivity to the gate oxide and to the dielectric spacers;

forming a source region and a drain region in the substrate;

depositing doped polysilicon regions directly on the source and drain regions, thereby forming elevated source and drain regions having a height above the substrate surface equal to the height of the doped polysilicon regions;

removing the first gate material; and depositing a refractory metal directly on the gate oxide to serve as a second gate material subsequent to the removal of the first gate material.

17. The method of claim 16, wherein depositing the refractory metal includes simultaneously depositing the metal on the doped polysilicon regions to form refractory metal silicides.

18. The method of claim 16, wherein removing the first gate material comprises performing a reactive ion etch (RIE).

19. The method of claim 16, wherein the step of forming the source and drain regions includes forming the source and drain regions adjacent the pair of spacers.

20. A method for forming a device on a semiconductor substrate comprising:

forming a gate oxide over the substrate;

forming a first insulative gate material with opposing sides directly on the gate oxide;

forming a pair of dielectric spacers disposed adjacent to the opposing sides of the gate, wherein the first gate material has a high selectivity to the gate oxide and to the dielectric spacers;

forming elevated source and drain regions on the substrate by forming source and drain regions in the substrate and depositing doped polysilicon regions directly on the source and drain regions, the elevated source and drain regions having a height above the substrate surface equal to the height of the doped polysilicon regions;

removing the first gate material via a reactive ion etch; and simultaneously depositing a refractory metal directly on the gate oxide and on the doped polysilicon regions, subsequent to the removal of the first gate material, wherein the refractory metal serves as a second gate material and as a metal silicide within the source and drain regions.

21. The method of claim 20, wherein the step of forming the elevated source and drain regions includes forming the source and drain regions adjacent the pair of spacers.

* * * * *

UNITED STATES PATENT AND TRADEMARK OFFICE
CERTIFICATE OF CORRECTION

PATENT NO. : 6,140,190
DATED : October 31, 2000
INVENTOR(S) : Gardner et al.

It is certified that error appears in the above-identified patent and that said Letters Patent is hereby corrected as shown below:

Column 1,
Line 56, after "desire", please delete "is".

Column 3,
Line 4, after "features", please insert -- relate to --.

Column 5,
Line 48, after "metal" please insert -- . --.
Line 67, after "several", please delete "devices".

Signed and Sealed this

Eighth Day of October, 2002

Attest:

JAMES E. ROGAN
Attesting Officer    Director of the United States Patent and Trademark Office